(12) United States Patent
Ishizuka (10) Patent No.: US 10,840,873 B2
(45) Date of Patent: Nov. 17, 2020

(54) COIL DEVICE

(71) Applicant: Murata Manufacturing Co., Ltd., Nagaokakyo (JP)

(72) Inventor: Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 206 days.

(21) Appl. No.: 15/873,010

(22) Filed: Jan. 17, 2018

(65) Prior Publication Data

US 2018/0145653 A1     May 24, 2018

Related U.S. Application Data

(63) Continuation of application No. PCT/JP2016/071790, filed on Jul. 26, 2016.

(30) Foreign Application Priority Data

Aug. 7, 2015 (JP) ................................. 2015-156812
Nov. 6, 2015 (JP) ................................. 2015-218518

(51) Int. Cl.
| | |
|---|---|
| *H03H 7/38* | (2006.01) |
| *H01F 17/00* | (2006.01) |
| *H01F 27/38* | (2006.01) |
| *H01F 27/42* | (2006.01) |
| *H01F 30/10* | (2006.01) |

(Continued)

(52) U.S. Cl.
CPC ........... *H03H 7/38* (2013.01); *H01F 17/0013* (2013.01); *H01F 19/04* (2013.01);
(Continued)

(58) Field of Classification Search
CPC ....... H03H 7/38; H01F 17/0013; H01F 19/04; H01F 27/2804; H01F 27/29; H01F 27/38;
(Continued)

(56) References Cited

U.S. PATENT DOCUMENTS

2012/0139814 A1* 6/2012 Ishizuka .................... H01P 1/20
343/860
2015/0035625 A1    2/2015 Ohtomo et al.
(Continued)

FOREIGN PATENT DOCUMENTS

| JP | 2001-036328 A | 2/2001 |
|---|---|---|
| JP | 5505582 B1 | 5/2014 |

(Continued)

OTHER PUBLICATIONS

Yousif, Mahmoud, The Unified Force of Nature: 1—The Electric and Magnetic Forces, IOSR Journal of Applied Physics, vol. 10, Issue 5 Ver I (Sep.-Oct. 2018) Fig. 6, p. 67 (Year: 2018).*

(Continued)

*Primary Examiner* — Samuel S Outten
(74) *Attorney, Agent, or Firm* — Keating & Bennett, LLP (57) ABSTRACT

A coil device includes a first coil wound around a winding axis, and a second coil substantially overlapping the first coil when viewed from a winding axis direction of the first coil. The second coil includes first and second portions adjacent to each other in the winding axis direction. The first and second portions extend so that the directions of electric current flowing through the first and second portions are opposite to each other, and a coil opening is provided between the first and second portions.

13 Claims, 9 Drawing Sheets

(51) Int. Cl.
  *H01F 37/00* (2006.01)
  *H01F 19/04* (2006.01)
  *H01F 27/28* (2006.01)
  *H01F 27/29* (2006.01)
  *H01F 41/04* (2006.01)
  *H03H 1/00* (2006.01)

(52) U.S. Cl.
  CPC ......... *H01F 27/2804* (2013.01); *H01F 27/29* (2013.01); *H01F 27/38* (2013.01); *H01F 27/42* (2013.01); *H01F 30/10* (2013.01); *H01F 37/00* (2013.01); *H01F 41/041* (2013.01); *H01F 2017/004* (2013.01); *H01F 2027/2809* (2013.01); *H03H 2001/0085* (2013.01)

(58) Field of Classification Search
  CPC .......... H01F 27/42; H01F 30/10; H01F 37/00; H01F 41/041
  See application file for complete search history.

(56) References Cited

U.S. PATENT DOCUMENTS

2015/0180440 A1  6/2015  Ishizuka
2016/0248397 A1  8/2016  Ishizuka

FOREIGN PATENT DOCUMENTS

| JP | 2014-143263 A | 8/2014 |
| WO | 2012/036207 A1 | 3/2012 |
| WO | 2015/068614 A1 | 5/2015 |

OTHER PUBLICATIONS http://fourier.eng.hmc.edu/e84/lectures/ch1/node3.html, accessed record of Jan. 9, 2015 via internet archive (Year: 2015).*

Official Communication issued in International Patent Application No. PCT/JP2016/071790, dated Oct. 18, 2016.

* cited by examiner

COIL DEVICE

CROSS REFERENCE TO RELATED APPLICATIONS

This application claims the benefit of priority to Japanese Patent Application No. 2015-218518 filed on Nov. 6, 2015 and Japanese Patent Application No. 2015-156812 filed on Aug. 7, 2015 and is a Continuation Application of PCT Application No. PCT/JP2016/071790 filed on Jul. 26, 2016. The entire contents of each application are hereby incorporated herein by reference.

BACKGROUND OF THE INVENTION

1. Field of the Invention

The present invention relates to a coil device included in an inductance element, an impedance conversion circuit, a voltage conversion circuit, and other devices.

2. Description of the Related Art

A transformer is used as an impedance conversion circuit or a voltage conversion circuit in various electronic circuits. A transformer which is a small electronic component mounted on a circuit substrate is often configured as a surface-mounted component including a coil in a multilayer substrate made by stacking a plurality of base material layers (for example, Japanese Patent No. 5505582).

In recent years, mobile electronic devices, such as cellular phone terminals, are required to be smaller and thinner, and additionally, an increase in the number of components due to sophistication also requires higher mounting density.

To add an inductance element for matching, an inductance element for a resonance circuit, or other similar inductance element to a multilayer substrate including a coil, it is conceivable to add another coil other than the coil for a transformer ("transformer coil").

However, when the multilayer substrate including the transformer coil is configured to further include another coil, unnecessary coupling may occur between the transformer coil and this other coil. To prevent unnecessary coupling, it is conceivable to arrange the transformer coil and the other coil at a distance in the multilayer substrate. However, this results in an increase in the size of the multilayer substrate. Additionally, it is conceivable to arrange the transformer coil and the other coil so that the directions of magnetic fluxes in the transformer coil and the other coil will not be aligned, or to provide a shielding member between the transformer coil and the other coil. However, this results in a reduction of the Q value of the coils.

The above-described problems are not limited to a device provided with a transformer coil and another coil, but are common to coil devices provided with at least two coils with different functions.

SUMMARY OF THE INVENTION

Preferred embodiments of the present invention provide coil devices that significantly reduce or prevent an increase in size, increase the independence of at least two coils, and significantly reduce or prevent a reduction of the coil characteristics such as the Q value.

A coil device according to a preferred embodiment of the present invention includes a first coil wound around a winding axis; and a second coil substantially overlapping the first coil when viewed from a winding axis direction of the first coil, wherein the second coil includes a first portion and a second portion that are adjacent to each other in the winding axis direction, and the first portion and the second portion extend or are folded so that directions of electric current flowing through the first portion and the second portion are opposite to each other, and a coil opening is provided between the first portion and the second portion.

With the above-described configuration, the coil opening of the first coil is not blocked by the second coil, and accordingly, reduction of the Q value of the first coil is reduced or prevented. In addition, because the coil opening of the second coil and the coil opening of the first coil are orthogonal or substantially orthogonal to each other, the first coil and the second coil may be used as independent coils.

In a coil device according to a preferred embodiment of the present invention, it is preferable that the coil device includes a first terminal and a second terminal, a first end of the second coil being connected to a second end of the first coil, a first end of the first coil being connected to the first terminal, and a second end of the second coil being connected to the second terminal. Accordingly, the coil device may be used as a coil device that includes the first coil and the second coil which are connected in series, and that is provided with two terminals.

In a coil device according to a preferred embodiment of the present invention, it is preferable that the coil device includes a first terminal, a second terminal, and a third terminal, the first coil defining a primary coil portion and a secondary coil portion of a transformer, a first end of the primary coil portion being connected to the first terminal, a second end of the primary coil portion being connected to the third terminal, a first end of the secondary coil portion being connected to a first end of the second coil, and a second end of the secondary coil portion being connected to the third terminal. Accordingly, the coil device may be used as a coil device in which the first coil defines a transformer, and the second coil, which is not magnetically and undesirably coupled to the transformer and which is independent, is connected in series with a secondary coil portion of the transformer.

In a coil device according to a preferred embodiment of the present invention, it is preferable that the coil device includes a first terminal, a second terminal, and a third terminal, the first coil defining a primary coil portion and a secondary coil portion of a transformer, a first end of the primary coil portion being connected to the first terminal, a second end of the primary coil portion being connected to the third terminal, a first end of the secondary coil portion being connected to the second terminal, a second end of the secondary coil portion being connected to the third terminal, a first end of the second coil being connected to the second terminal, and a second end of the second coil being connected to the first terminal. Accordingly, the coil device may be used as a coil device provided with a transformer in which a primary coil is connected between a first terminal and a third terminal and a secondary coil is connected between a second terminal and the third terminal, and the second coil being connected between the first terminal and the second terminal.

In a coil device according to a preferred embodiment of the present invention, it is preferable that the coil device further includes a fourth terminal, a second end of the first coil being connected to the fourth terminal. Accordingly, the coil device may be used as a coil device that includes the first coil connected between the first terminal and a fourth terminal, and the second coil connected between the second terminal and the fourth terminal.

In a coil device according to a preferred embodiment of the present invention, it is preferable that the coil device includes a multilayer body including a plurality of base material layers that are stacked, the first coil and the second coil overlapping each other in a stacking direction. Accordingly, simply by staking a plurality of base material layers defining the first coil and a plurality of base material layers defining the second coil, the first coil and the second coil are arranged in a multilayer body, thus obtaining a coil device that occupies a small area when being mounted on a circuit substrate or other suitable substrate.

According to preferred embodiments of the present invention, coil devices that significantly reduce or prevent an increase in size, increase the independence of at least two coils, and significantly reduce or prevent a reduction of the coil characteristics such as the Q value is obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a plurality of preferred embodiments of the present invention will be described by providing a few specific examples with reference to the drawings. In the drawings, the same portions are denoted by the same reference numeral. Considering the ease of description or understanding of main points, the preferred embodiments will be described separately for the sake of convenience. However, configurations described in different preferred embodiments may be partially replaced or combined. From a second preferred embodiment onward, descriptions of points that are common to those of a first preferred embodiment will be omitted, and only different points will be described. In particular, the same or similar advantageous effects achieved by the same or similar configuration will not be mentioned in each of the preferred embodiments.

First Preferred Embodiment

In a first preferred embodiment of the present invention, a coil device 101 including a first coil defining a transformer, and a second coil connected in series with a secondary coil of the transformer will be described. The coil device 101 is used in, for example, an inductance element, an impedance conversion circuit, a voltage conversion circuit, and other suitable devices.

Figure 1:
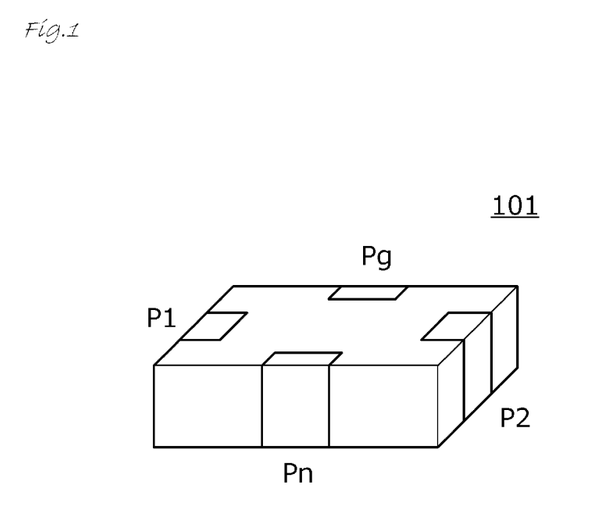
FIG. 1 is a perspective view of a coil device 101 according to a first preferred embodiment of the present invention.
Figure 2:
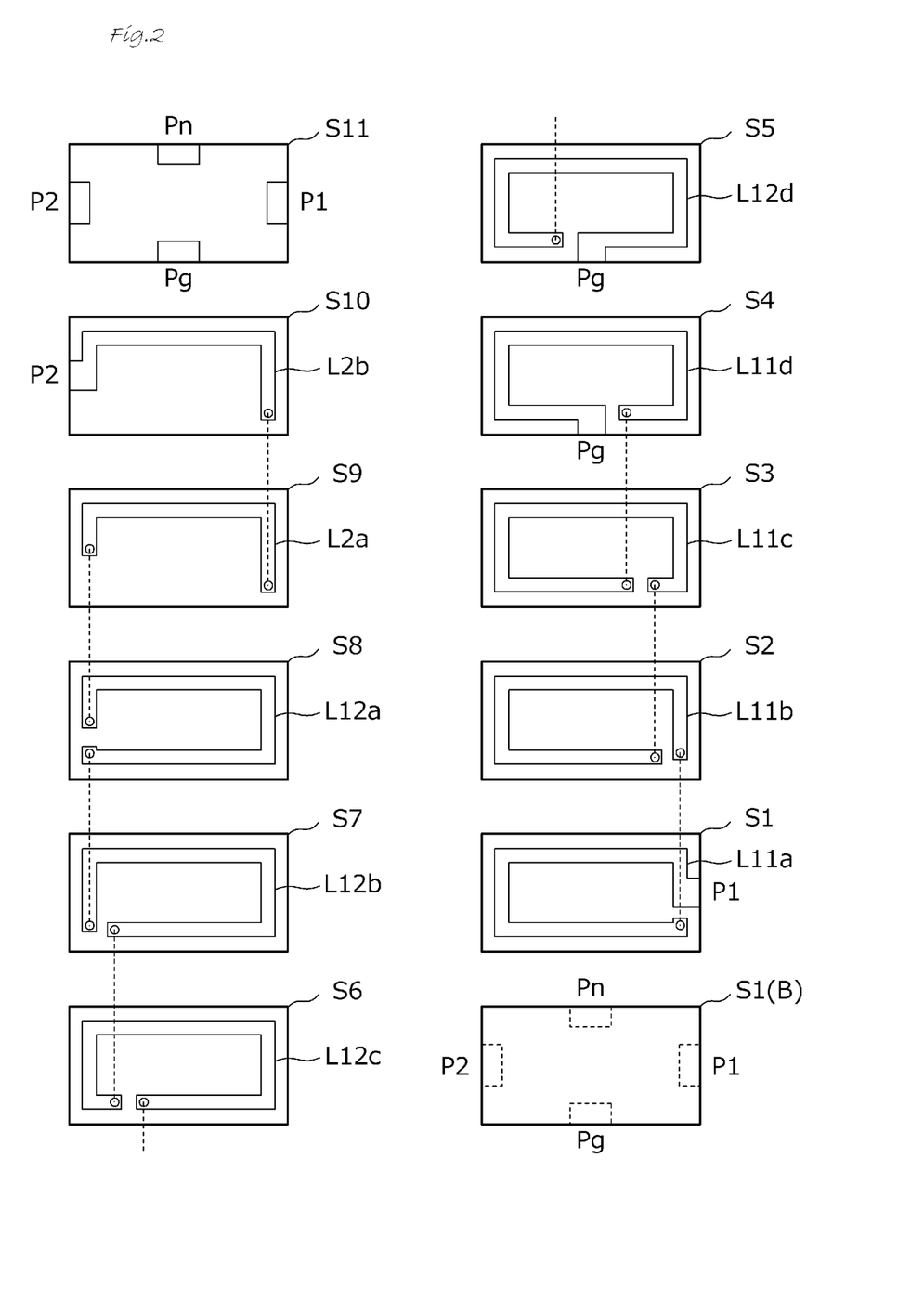
FIG. 2 is an exploded plan view illustrating conductor patterns provided on base material layers of the coil device 101.
Figure 3:
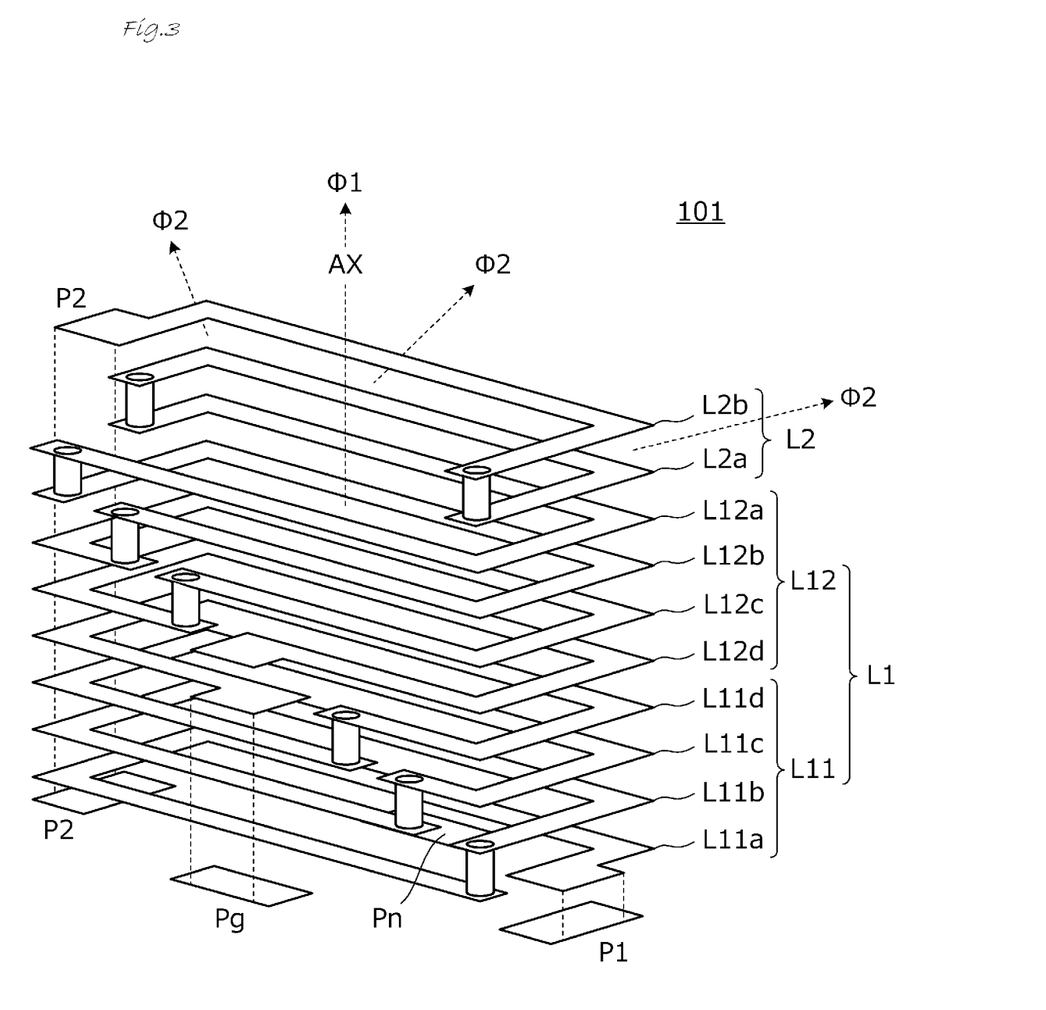
FIG. 3 is a perspective view of the conductor patterns provided on the base material layers of the coil device 101.
Figure 4:
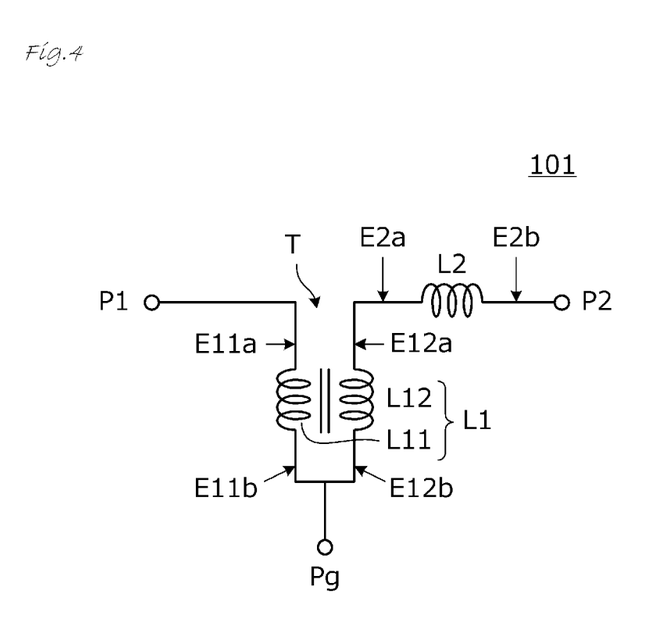
FIG. 4 is a circuit diagram of the coil device 101.

FIG. 1 is a perspective view of the coil device 101 according to the first preferred embodiment. FIG. 2 is an exploded plan view illustrating conductor patterns provided on base material layers. FIG. 3 is a perspective view of the conductor patterns provided on the base material layers. Note that FIG. 3 is extended (exaggerated) in a stacking direction, except for the base material layers on which the conductor patterns are provided. The conductor pattern on the top layer is not illustrated in FIG. 3. FIG. 4 is a circuit diagram of the coil device 101.

As illustrated in FIG. 4, a first coil L1 defines a primary coil portion L11 and a secondary coil portion L12 of a transformer T. A first end E11a of the primary coil portion L11 is connected to a first terminal P1. A second end E11b of the primary coil portion L11 is connected to a third terminal Pg. A first end E12a of the secondary coil portion L12 is connected to a first end E2a of a second coil L2. A second end E12b of the secondary coil portion L12 is connected to the third terminal Pg. A second end E2b of the second coil L2 is connected to a second terminal P2.

The coil device 101 includes a multilayer body including a plurality of base material layers that are stacked. In the multilayer body, the first coil and the second coil overlap each other in a stacking direction of the base material layers. On the outer surface of the multilayer body which is preferably a rectangular or substantially rectangular parallelepiped, the first terminal P1, the second terminal P2, the third terminal Pg, and a free terminal Pn for mounting are respectively provided. The third terminal Pg is used as, for example, a ground terminal, and the first terminal P1 and the second terminal P2 are used as input/output terminals, for example.

As illustrated in FIG. 2, conductor patterns are respectively provided on the top surfaces of base material layers S1 to S11. In FIG. 2, a base material layer S1(B) is the back surface of the base material layer S1. In FIG. 2, an inter-layer connection conductor (via conductor) is represented by a broken line. Conductor patterns L11a, L11b, L11c, and L11d and a plurality of inter-layer connection conductors provided on and in the base material layers S1 to S4 define the primary coil portion L11, which preferably includes about 3.75 turns, for example. In addition, conductor patterns L12a, L12b, L12c, and L12d and a plurality of inter-layer connection conductors provided on and in the base material layers S8 to S5 define the secondary coil portion L12, which preferably includes about 3.75 turns, for example. The conductor patterns L11a to L11d of the primary coil portion L11 and the conductor patterns L12a to L12d of the secondary coil portion L12 extend along one rectangular path. The primary coil portion L11 and the secondary coil portion L12 have an identical or substantially identical winding axis. The primary coil portion L11 operates as a primary coil of the transformer T, and the secondary coil portion L12 operates as a secondary coil of the transformer T.

Conductor patterns L2A and L2B are provided on the base material layers S9 and S10, respectively. The conductor patterns L2a and L2b and an inter-layer connection conductor define the second coil L2. The conductor pattern L2a is a first portion of the second coil L2, and the conductor pattern L2b is a second portion of the second coil L2.

The second coil L2 substantially overlaps the first coil L1 when viewed from the winding axis direction of the first coil L1. Therefore, a coil opening of the first coil L1 is not blocked by the second coil L2, and accordingly, reduction of the Q value of the first coil is reduced or prevented.

The first portion (L2a) and the second portion (L2b) extend (are folded) so that the directions of electric current flowing through the first portion (L2a) and the second portion (L2b) are opposite to each other. Therefore, a gap provided between the first portion (L2a) and the second portion (L2b) is a coil opening of the second coil L2. A magnetic flux φ2 in FIG. 3 represents a magnetic flux that passes through the coil opening of the second coil L2. In contrast, the coil opening of the first coil L1 is open towards the above-described winding axis AX direction. Therefore, a magnetic flux φ1 passing through the coil opening of the first coil L1 and the magnetic flux φ2 passing through the coil opening of the second coil L2 are orthogonal or substantially orthogonal to each other and are not significantly magnetic-field coupled to each other. That is, the first coil L1 does not block the opening of the second coil L2. Accordingly, reduction of the Q value of the second coil is also significantly reduced or prevented.

In addition, the directions of magnetic fluxes are opposite for the conductor patterns L12a and L2a, but are the same for the conductor patterns L12a and L2b. Thus, when viewed as a whole, the magnetic field coupling between the conductor pattern L12a and the conductor patterns (L2a and L2b) is weak.

The conductor pattern L12a, which is one of the conductor patterns of the first coil that is adjacent to the second coil, and the conductor pattern L2a, which is one of the conductor patterns of the second coil that is adjacent to the first coil, have such a relationship that the conductor patterns L12a and L2a extend (are folded) so that the directions of electric current flowing through the conductor patterns L12a and L2a are opposite to each other. Therefore, the electric field coupling between the conductor pattern L12a and the conductor pattern L2a is weak.

According to the above-described operation, the first coil L1 and the second coil L2 operate as coils that are substantially magnetically and electrically independent coils.

Second Preferred Embodiment

In a second preferred embodiment of the present invention, a coil device including a first coil defining a transformer, and a second coil connected between a primary coil and a secondary coil of the transformer will be described.

Figure 5:
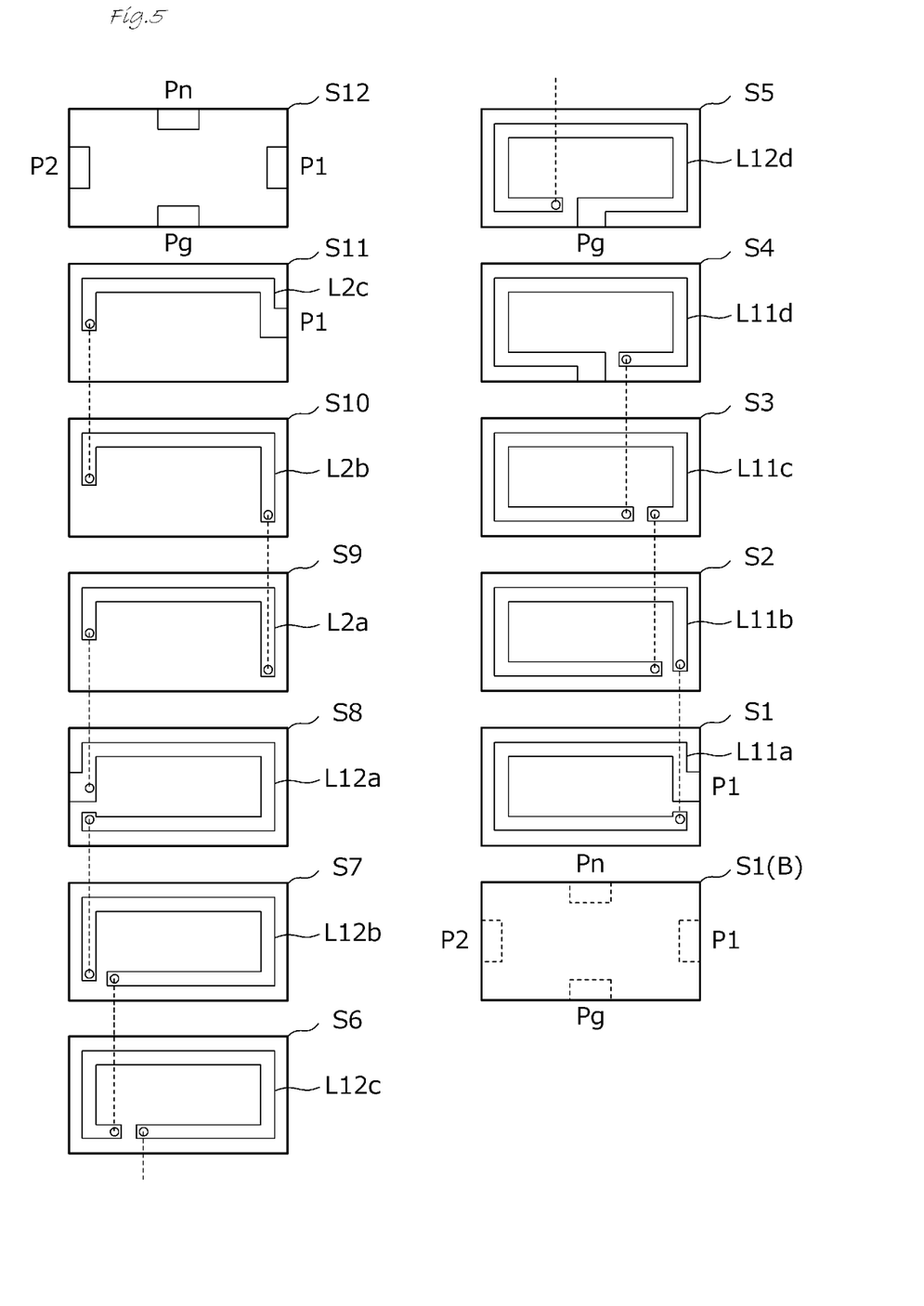
FIG. 5 is an exploded plan view illustrating conductor patterns provided on base material layers of a coil device 102 according to a second preferred embodiment of the present invention.
Figure 6:
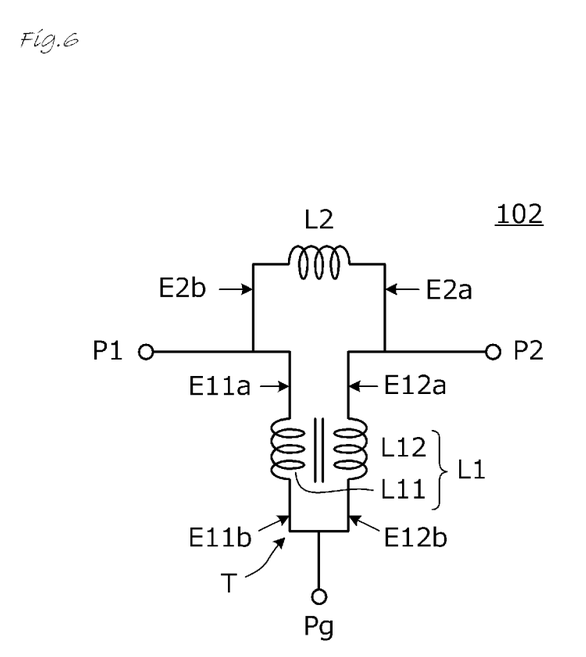
FIG. 6 is a circuit diagram of the coil device 102.

FIG. 5 is an exploded plan view illustrating conductor patterns provided on base material layers of a coil device 102 according to the second preferred embodiment. The external appearance is the same as that illustrated in FIG. 1 of the first preferred embodiment. FIG. 6 is a circuit diagram of the coil device 102.

As illustrated in FIG. 6, a first coil L1 defines a primary coil portion L11 and a secondary coil portion L12 of a transformer T. A first end E11a of the primary coil portion L11 is connected to a first terminal P1. A second end L11b of the primary coil portion L11 is connected to a third terminal Pg. A first end E12a of the secondary coil portion L12 is connected to a first end E2a of a second coil L2. A second end E12b of the secondary coil portion L12 is connected to the third terminal Pg. A second end E2b of the second coil L2 is connected to the first terminal P1.

As illustrated in FIG. 5, conductor patterns are respectively provided on the top surfaces of base material layers S1 to S12. In FIG. 5, a base material layer S1(B) is the back surface of the base material layer S1. In FIG. 5, an inter-layer connection conductor (via conductor) is represented by a broken line. Conductor patterns L11a, L11b, L11c, and L11d and a plurality of inter-layer connection conductors provided on and in the base material layers S1 to S4 define the primary coil portion L11, which preferably includes about 3.75 turns, for example. In addition, conductor patterns L12a, L12b, L12c, and L12d and a plurality of inter-layer connection conductors provided on and in the base material layers S8 to S5 define the secondary coil portion L12, which preferably includes about 3.75 turns, for example. The conductor patterns L11a to L11d of the primary coil portion L11 and the conductor patterns L12a to L12d of the secondary coil portion L12 extend along one rectangular path. The primary coil portion L11 and the secondary coil portion L12 have an identical or substantially identical winding axis. The primary coil portion L11 operates as a primary coil of the transformer T, and the secondary coil portion L12 operates as a secondary coil of the transformer T.

Conductor patterns L2a, L2b, and L2c are provided on the base material layers S9, S10, and S11, respectively. The conductor patterns L2a, L2b, and L2c and inter-layer connection conductors define the second coil L2. The conductor patterns L2a and L2c are first portions of the second coil L2, and the conductor pattern L2b is a second portion of the second coil L2.

Similar to the coil device 101 according to the first preferred embodiment, reduction of the Q value of the first coil L1 and the second coil L2 is reduced or prevented even though the first coil L1 and the second coil L2 are close to each other. Similar to the coil device 101 according to the first preferred embodiment, the first coil L1 and the second coil L2 operate as coils that are substantially magnetically and electrically independent coils.

According to the present preferred embodiment, a signal in a relatively high frequency band is impedance-converted by the transformer T illustrated in FIG. 6, and a signal in a relatively low frequency band bypasses the second coil L2 and passes through.

To reduce the coupling coefficient between the second coil L2 and the first coil L1 as much as possible, it is preferable that the number of conductor patterns included in the second coil L2 (the number of layers on which conductor patterns are formed) be an even number. However, as illustrated in FIG. 5 of the present preferred embodiment, the number may be an odd number (three, namely, the conductor patterns L2a, L2b, and L2c).

Third Preferred Embodiment

In a third preferred embodiment of the present invention, a coil device that is provided with a first terminal P1 and a second terminal P2, and that is additionally provided with, between the first terminal P1 and the second terminal P2, a circuit including a first coil L1 and a second coil L2 that are connected in series will be described.

Figure 7A:
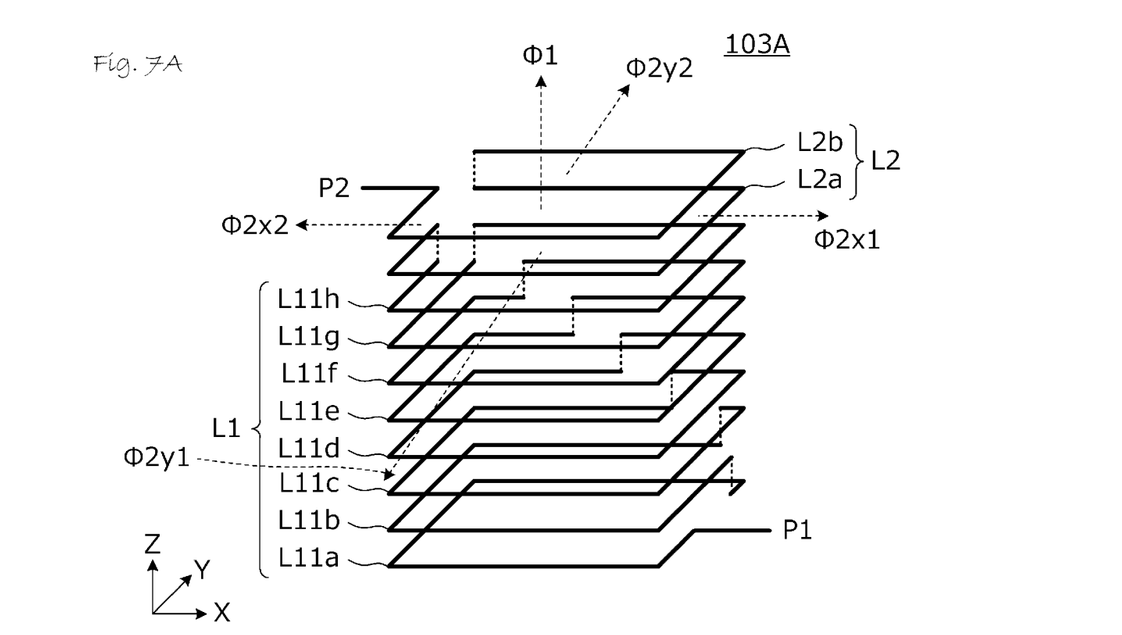
FIGS. 7A and 7B are perspective views of conductor patterns provided on base material layers of coil devices 103A and 103B, respectively, according to a third preferred embodiment of the present invention.
Figure 7B:
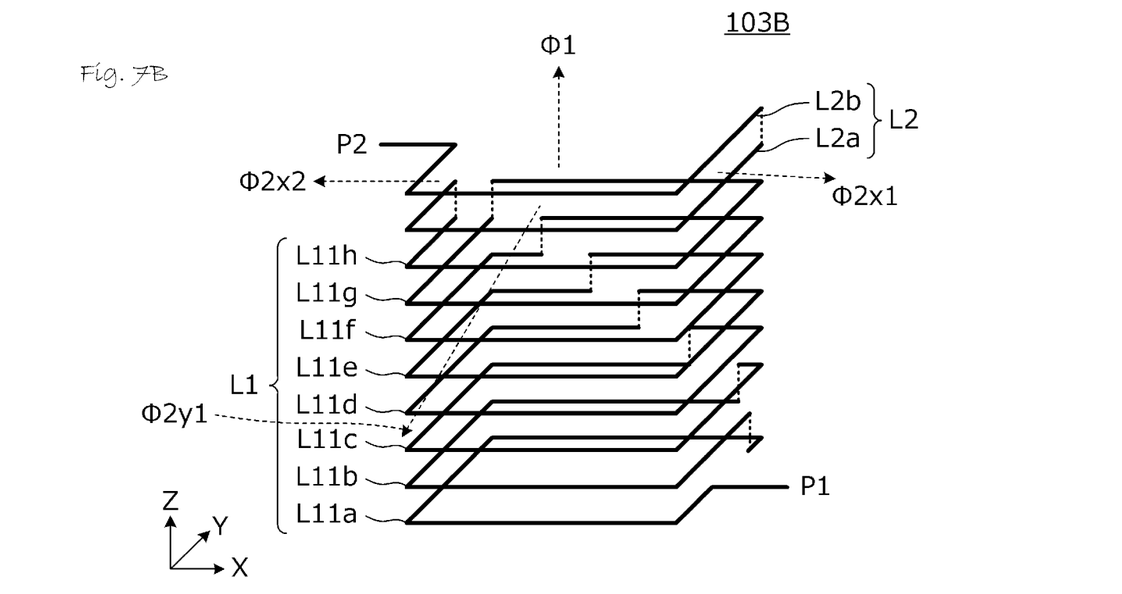
Figure 8:
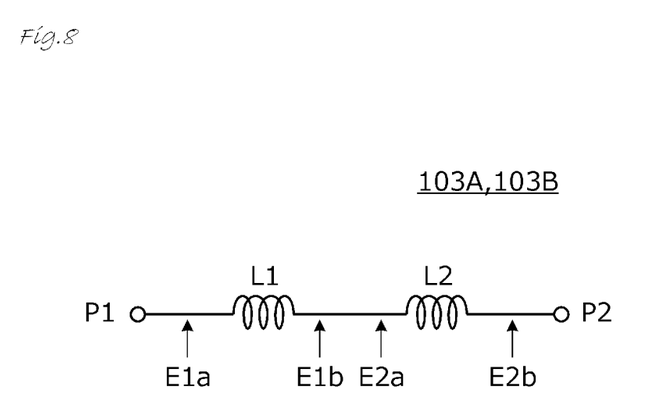
FIG. 8 is a circuit diagram of the coil devices 103A and 103B.

FIGS. 7A and 7B are perspective views of conductor patterns provided on base material layers of coil devices 103A and 103B, respectively, according to the third preferred embodiment. Note that base material layers on which conductor patterns are provided are omitted in FIGS. 7A and 7B. Additionally, the line width of each of the conductor patterns is represented to be thinner in FIGS. 7A and 7B. FIG. 8 is a circuit diagram of the coil devices 103A and 103B.

As illustrated in FIG. 8, a first end E2a of the second coil L2 is connected to a second end E1b of the first coil L1. A first end E1a of the first coil L1 is connected to the first terminal P1. A second end E2b of the second coil L2 is connected to the second terminal P2.

The coil devices 103A and 103B each include a multilayer body including a plurality of base material layers that are stacked. In the multilayer body, the first coil L1 and the second coil L2 overlap each other in the stacking direction of the base material layers. On the outer surface of the multilayer body, the first terminal P1 and the second terminal P2 are respectively provided.

Conductor patterns L11a to L11h and a plurality of inter-layer connection conductors connecting the conductor patterns L11a to L11h define the first coil L1, which preferably includes about 7.5 turns, for example. In addition, conductor patterns L2a and L2b and an inter-layer connection conductor connecting the conductor patterns L2a and L2b define the second coil L2. The conductor pattern L2a is a first portion of the second coil L2, and the conductor pattern L2b is a second portion of the second coil L2.

The coil device 103A and the coil device 103B have different patterns when viewed in plan of the second coil L2. In the coil device 103A, the first portion L2a and the second portion L2b of the second coil L2 include two sides extending in the X direction and two sides extending in the Y direction. In contrast, in the coil device 103B, the first portion L2a and the second portion L2b of the second coil L2 include one side extending in the X direction and two sides extending in the Y direction.

As illustrated in FIG. 7A, the directions of magnetic fluxes $\phi 2y1$ and $\phi 2y2$ passing through the coil opening of the second coil L2 are opposite to each other. Thus, the magnetic fluxes $\phi 2y1$ and $\phi 2y2$ are canceled out to some extent. Therefore, it is difficult to obtain a high inductance for a long total path length of the first portion L2a and the second portion L2b of the second coil.

In the coil device 103B in FIG. 7B, a side that extends in the X direction, which is the longitudinal direction, is one side. Thus, the above-mentioned cancellation does not occur. Although the directions of magnetic fluxes $\phi 2x1$ and $\phi 2x2$ passing through the coil opening of the second coil L2 are opposite to each other, because two sides extending in the Y direction are relatively distant from each other, the cancellation between the magnetic fluxes $\phi 2x1$ and $\phi 2x2$ is small. Therefore, a high inductance is able to be obtained in the coil device 103B for a short total path length of the first portion L2a and the second portion L2b.

According to the present preferred embodiment, similarly to the coil device 101 according to the first preferred embodiment, reduction of the Q value of the first coil L1 and the second coil L2 is reduced or prevented even though the first coil L1 and the second coil L2 are close to each other. In addition, similarly to the coil device 101 according to the first preferred embodiment, the first coil L1 and the second coil L2 operate as coils that are substantially magnetically and electrically independent coils.

Because the coil devices 103A and 103B according to the present preferred embodiment are such that the direction of a magnetic flux $\phi 1$ due to the first coil L1 and the direction of a magnetic flux $\phi 2$ ($\phi 2x1$, $\phi 2x2$, $\phi 2y1$, and $\phi 2y2$) due to the second coil L2 are different (orthogonal or substantially orthogonal to each other), the coil devices 103A and 103B are able to be used as an antenna with two-directional directivity. For example, the coil devices 103A and 103B may preferably be used as an HF-band antenna for NFC (Near Field Communication).

Fourth Preferred Embodiment

In a fourth preferred embodiment of the present invention, a coil device that is provided with a first terminal P1, a second terminal P2, and a fourth terminal Pc, and that is additionally provided with a first coil L1 between the first terminal P1 and the fourth terminal Pc and a second coil L2 between the second terminal P2 and the fourth terminal Pc will be described.

Figure 9:
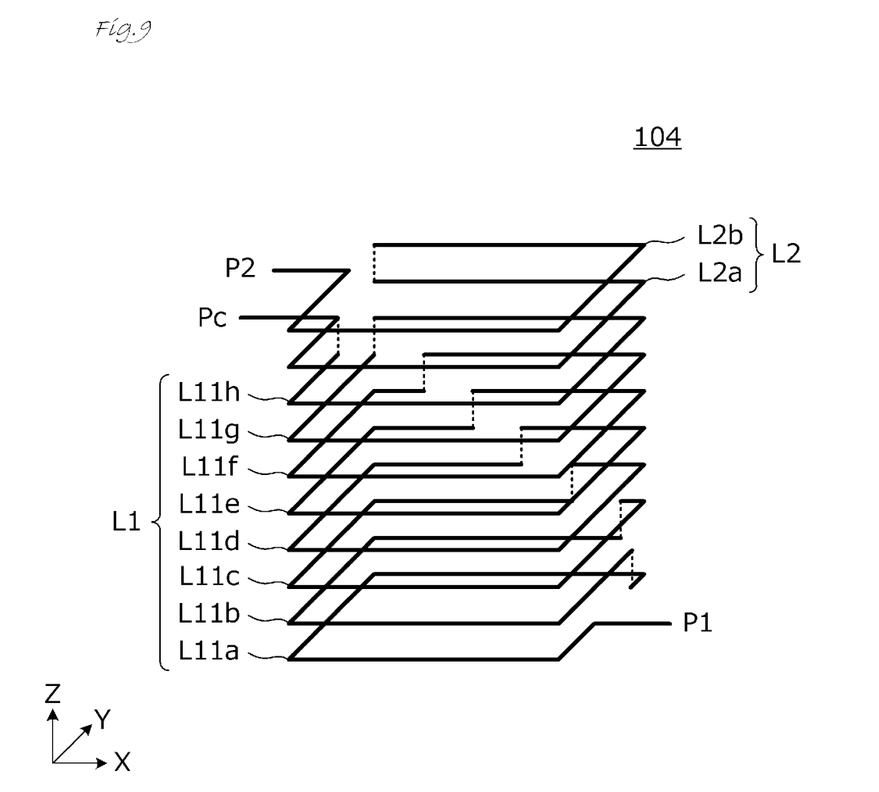
FIG. 9 is a perspective view of conductor patterns provided on base material layers of a coil device 104 according to a fourth preferred embodiment of the present invention.
Figure 10:
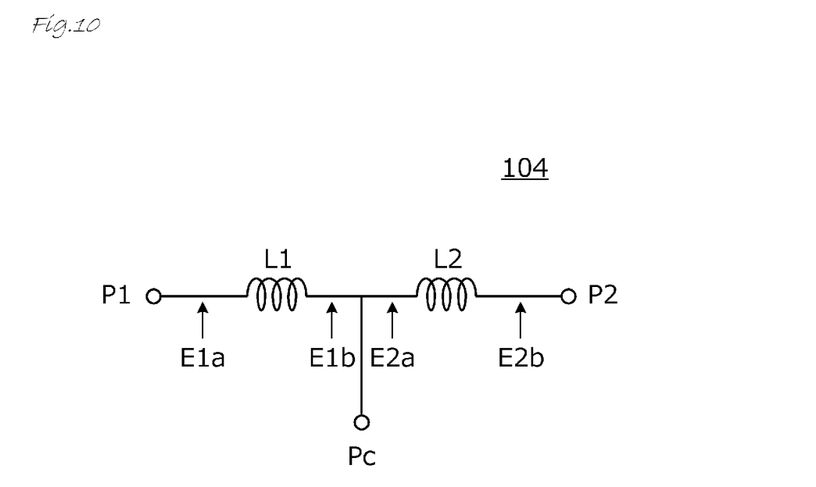
FIG. 10 is a circuit diagram of the coil device 104.

FIG. 9 is a perspective view of conductor patterns provided on base material layers of a coil device 104 according to the fourth preferred embodiment. Note that base material layers on which conductor patterns are provided are omitted in FIG. 9. Additionally, the line width of each of the conductor patterns is represented to be thinner in FIG. 9. FIG. 10 is a circuit diagram of the coil device 104.

As illustrated in FIG. 10, a first end E2a of the second coil L2 is connected to a second end E1b of the first coil L1. A first end E1a of the first coil L1 is connected to the first terminal P1. A second end E2b of the second coil L2 is connected to the second terminal P2. A second end E1b of the first coil L1 is connected to the fourth terminal Pc.

The coil device 104 includes a multilayer body including a plurality of base material layers that are stacked. In the multilayer body, the first coil L1 and the second coil L2 overlap each other in the stacking direction of the base material layers. On the outer surface of the multilayer body, the first terminal P1, the second terminal P2, and the fourth terminal Pc are respectively provided.

Conductor patterns L11a to L11h and a plurality of inter-layer connection conductors connecting the conductor patterns L11a to L11h define the first coil L1, which preferably includes about 7.5 turns, for example. In addition, conductor patterns L2a and L2b and an inter-layer connection conductor connecting the conductor patterns L2a and L2b define the second coil L2. The conductor pattern L2a is a first portion of the second coil L2, and the conductor pattern L2b is a second portion of the second coil L2. The coil device 104 is different from the coil device 103A according to the third preferred embodiment in that the coil device 104 is provided with the fourth terminal Pc.

According to the present preferred embodiment, the first coil L1 and the second coil L2, which are electrically and magnetically independent from each other, may use, for example, the fourth terminal Pc as a common terminal.

Fifth Preferred Embodiment

In a fifth preferred embodiment of the present invention, an example in which the number of layers on which conductor patterns defining a second coil are provided is preferably three or more layers, for example, will be described.

Figure 11:
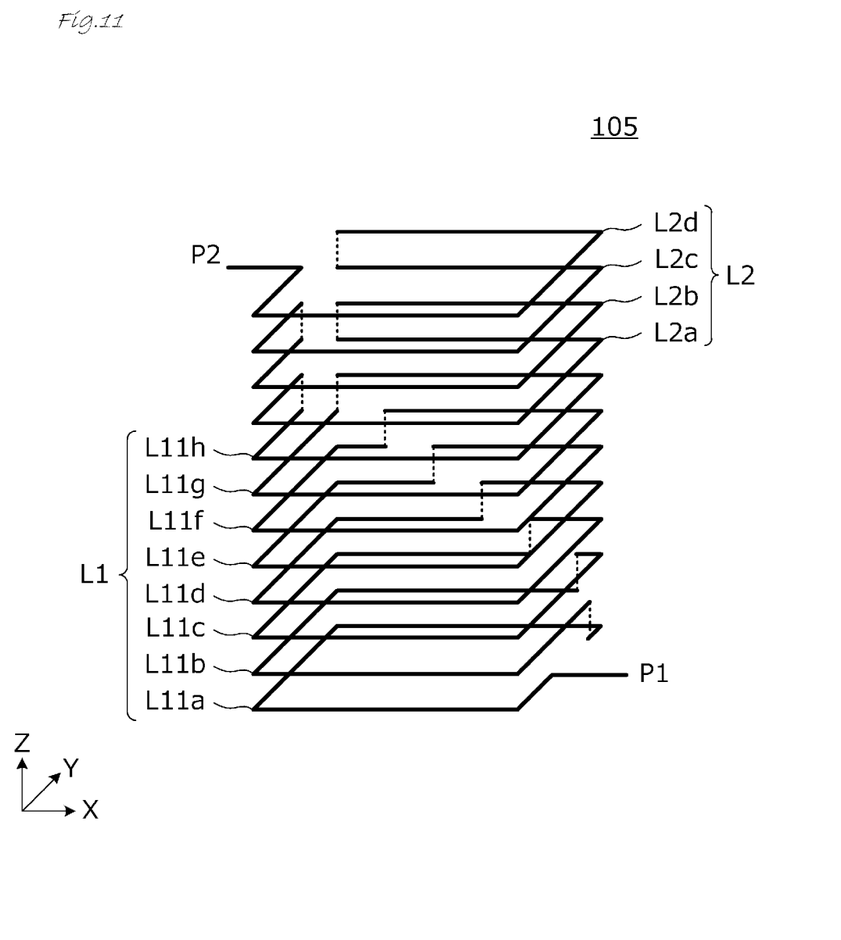
FIG. 11 is a perspective view of conductor patterns provided on base material layers of a coil device 105 according to a fifth preferred embodiment of the present invention.

FIG. 11 is a perspective view of conductor patterns provided on base material layers of a coil device 105 according to the fifth preferred embodiment. Note that base material layers on which conductor patterns are provided are omitted in FIG. 11. Additionally, the line width of each of the conductor patterns is represented to be thinner in FIG. 11.

The coil device 105 includes a multilayer body including a plurality of base material layers that are stacked. In the multilayer body, a first coil L1 and a second coil L2 overlap each other in the stacking direction of the base material layers. On the outer surface of the multilayer body, a first terminal P1 and a second terminal P2 are provided.

Unlike the coil device 103A illustrated in FIG. 7A of the third preferred embodiment, conductor patterns L2a, L2b, L2c, and L2d are stacked and arranged sequentially. These conductor patterns L2a, L2b, L2c, and L2d and inter-layer connection conductors connecting these conductor patterns L2a, L2b, L2c, and L2d define the second coil L2. The conductor patterns L2a and L2c are first portions of the second coil L2, and the conductor pattern L2b and L2d are second portions of the second coil L2.

Similar to the present preferred embodiment, even if the second coil L2 including a plurality of first portions and a plurality of second portions is provided, reduction of the Q value of the first coil L1 and the second coil L2 is reduced or prevented. In addition, the first coil L1 and the second coil L2 operate as coils that are substantially magnetically and electrically independent coils.

Finally, the descriptions of the above-described preferred embodiments are only exemplary in all respects and are not construed to be limiting. Modifications or changes may be made to the preferred embodiments by those skilled in the art. For example, configurations described in different preferred embodiments may be partially replaced or combined. The scope of the present invention is defined not by the above-described preferred embodiments, but by the claims. In addition, it is intended that equivalents to the scope of the claims and all changes that are within the scope of the claims be included within the scope of the present invention. For example, although the preferred embodiments illustrated in FIG. 2 and other figures describe examples in which conductor patterns provided on different base material layers are connected by inter-layer connection conductors penetrating through the base material layers, the inter-layer connection conductors may be provided on the end surfaces of the multilayer body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil device comprising:
a first coil wound around a winding axis; and
a second coil substantially overlapping the first coil when viewed from a winding axis direction of the first coil; wherein
the second coil includes a first portion and a second portion that are adjacent to each other in the winding axis direction;
the first portion and the second portion extend so that directions of electric current flowing through the first portion and the second portion are opposite to each other, and a coil opening is provided between the first portion and the second portion; and
the second coil only partially surrounds the winding axis of the first coil.

2. The coil device according to claim 1, further comprising:
a first terminal, a second terminal, and a third terminal; wherein
the first coil and the second coil are connected to each other, and a circuit defined by connecting the first coil and the second coil to each other is connected to the first terminal, the second terminal, and the third terminal.

3. The coil device according to claim 2, wherein
the first coil defines a primary coil portion and a secondary coil portion of a transformer;
a first end of the primary coil portion is connected to the first terminal;
a second end of the primary coil portion is connected to the third terminal;
a first end of the secondary coil portion is connected to a first end of the second coil;
a second end of the secondary coil portion is connected to the third terminal; and
a second end of the second coil is connected to the second terminal.

4. The coil device according to claim 3, wherein the primary coil portion includes about 3.75 turns.

5. The coil device according to claim 3, wherein the secondary coil portion includes about 3.75 turns.

6. The coil device according to claim 2, wherein
the first coil defines a primary coil portion and a secondary coil portion of a transformer;
a first end of the primary coil portion is connected to the first terminal;
a second end of the primary coil portion is connected to the third terminal;
a first end of the secondary coil portion is connected to the second terminal;
a second end of the secondary coil portion is connected to the third terminal;
a first end of the second coil is connected to the second terminal; and
a second end of the second coil is connected to the first terminal.

7. The coil device according to claim 6, wherein the primary coil portion includes about 3.75 turns.

8. The coil device according to claim 6, wherein the secondary coil portion includes about 3.75 turns.

9. The coil device according to claim 1, further comprising:
a first terminal and a second terminal; wherein
a first end of the second coil is connected to a second end of the first coil;
a first end of the first coil is connected to the first terminal; and
a second end of the second coil is connected to the second terminal.

10. The coil device according to claim 9, further comprising:
a fourth terminal; wherein
a second end of the first coil is connected to the fourth terminal.

11. The coil device according to claim 1, further comprising:
a multilayer body including a plurality of base material layers that are stacked; wherein
the first coil and the second coil overlap each other in a stacking direction.

12. The coil device according to claim 11, wherein the multilayer body has a rectangular or substantially rectangular parallelepiped shape.

13. The coil device according to claim 1, wherein the first coil and the second coil are structured such that a magnetic flux passing through a coil opening of the first coil and a magnetic flux passing through a coil opening of the second coil are orthogonal or substantially orthogonal to each other.

* * * * *